United States Patent
Lee et al.

(10) Patent No.: US 7,851,791 B2
(45) Date of Patent: Dec. 14, 2010

(54) THIN FILM TRANSISTOR HAVING N-TYPE AND P-TYPE CIS THIN FILMS AND METHOD OF MANUFACTURING THE SAME

(75) Inventors: Sang Su Lee, Daejeon (KR); Kibong Song, Daejeon (KR); Jeong Dae Suh, Daejeon (KR); Keongam Kim, Seoul (KR); Doo-Hee Cho, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 37 days.

(21) Appl. No.: 12/027,929

(22) Filed: Feb. 7, 2008

(65) Prior Publication Data

US 2008/0217610 A1 Sep. 11, 2008

(30) Foreign Application Priority Data

Mar. 9, 2007 (KR) ...................... 10-2007-0023589

(51) Int. Cl.
*H01L 29/267* (2006.01)
(52) U.S. Cl. .......................................... 257/42; 257/43
(58) Field of Classification Search .......... 257/E21.787, 257/59, 72; 438/84, 102
See application file for complete search history.

(56) References Cited

U.S. PATENT DOCUMENTS

| 4,145,233 | A | * | 3/1979 | Sefick et al. ................. 438/289 |
| 4,818,357 | A | * | 4/1989 | Case et al. ............. 204/192.25 |
| 5,909,615 | A | * | 6/1999 | Kuo ............................ 438/157 |
| 5,948,176 | A | | 9/1999 | Ramanathan et al. |
| 7,396,695 | B2 | * | 7/2008 | Cho et al. ...................... 438/30 |
| 2007/0238247 | A1 | * | 10/2007 | Ou et al. ..................... 438/257 |

FOREIGN PATENT DOCUMENTS

| JP | 11-121779 | 4/1999 |
| JP | 11-330507 | 11/1999 |
| JP | 2002-246617 | 8/2002 |
| KR | 1020020092643 | 12/2002 |
| KR | 1020050013063 | 2/2005 |

* cited by examiner

*Primary Examiner*—Marcos D Pizarro
*Assistant Examiner*—Sue Tang
(74) *Attorney, Agent, or Firm*—Lahive & Cockfield, LLP; EuiHoon Lee, Esq.

(57) ABSTRACT

Provided is a thin film transistor (TFT) which uses CIS ($CuInSe_2$), including Se, which is a chalcogen-based material, and can provide a rectifying function, and electric and optical switching functions of a diode. The TFT according to the present invention includes, a substrate, a gate electrode formed on a portion of the substrate, an insulating layer covering the substrate and a gate electrode, a plurality of CIS ($CuInSe_2$) films formed on the insulating layer so as to cover the region where the gate electrode is formed; and source/drain regions separated from each other so as to comprise a trench exposing a portion of a surface of the CIS films.

11 Claims, 6 Drawing Sheets

THIN FILM TRANSISTOR HAVING N-TYPE AND P-TYPE CIS THIN FILMS AND METHOD OF MANUFACTURING THE SAME

CROSS-REFERENCE TO RELATED PATENT APPLICATION

This application claims the benefit of Korean Patent Application No. 10-2007-0023589, filed on Mar. 9, 2007, in the Korean Intellectual Property Office, the disclosure of which is incorporated herein in its entirety by reference.

BACKGROUND OF THE INVENTION

1. Field of the Invention

The present invention relates to a thin film transistor (TFT), and more particularly, to a TFT that can provide a rectifying function, and electric and optical switching functions of a diode using an n-type CIS ($CuInSe_2$) and a p-type CIS.

2. Description of the Related Art

In general, CIS ($CuInSe_2$), including selenium (Se) which is a chalcogen-based material of group VIB in the periodic table, is classified as a chalcopyrite-based material. CIS has been widely used in solar devices, for example, solar cell devices, due to its high light efficiency. Also, non-energy devices using the CIS has been researched. The non-energy devices have been mainly limited to research into diode devices. For example, the diode devices can be a Schottky-diode or a light sensible diode based on a heterojunction formed of CuSe, which has been recently reported. However, considering the high light efficiency of the CIS, the CIS can be sufficiently applied to a switching device such as a light transistor.

SUMMARY OF THE INVENTION

The present invention provides a thin film transistor (TFT) which uses CIS ($CuInSe_2$), including Se, which is a chalcogen-based material, and can provide a rectifying function, and electric and optical switching functions of a diode.

The present invention also provides a method of manufacturing a TFT using the CIS.

According to an aspect of the present invention, there is provided a TFT, including: a substrate; a gate electrode formed on a portion of the substrate; an insulating layer covering the substrate and the gate electrode; a plurality of CIS ($CuInSe_2$) films formed on the insulating layer so as to cover a region where the gate electrode is formed; and source/drain regions separated from each other so as to form a trench exposing a portion of a surface of the CIS films.

The CIS films may have an n-type conductivity and a p-type conductivity, respectively. The CIS films may include a structure where a p-type CIS film is formed on an n-type CIS film. The CIS films may include a structure where an n-type CIS film is formed on a p-type CIS film.

The CIS films may be formed using $In_2Se_3$ and $Cu_2Se_3$, respectively. A conductivity type of the CIS film may be determined by a relative mole ratio of $In_2Se_3$ to $Cu_2Se_3$. When a relative mole ratio of the $In_2Se_3$ to the $Cu_2Se_3$ may be in a range of 0.1 to 0.5, the CIS film has a p-type conductivity. When a relative mole ratio of the $In_2Se_3$ to the $Cu_2Se_3$ may be in a range of 0.6 to 0.9, the CIS film has an n-type conductivity.

The thin film transistor may further include a passivation layer covering the source/drain regions and the exposed portion of the surface of the CIS films.

The substrate may be formed of glass or quartz. The gate electrode may include a conductive polysilicon, indium-tin oxide (ITO), or a metal. The insulating layer may include silicon oxide ($SiO_2$) or polymethyl methacrylate (PMMA) which is an organic polymer material. The source/drain regions may include a conductive polysilicon, indium-tin oxide (ITO), or a metal.

According to another aspect of the present invention, there is provided a TFT, includes: a substrate; a plurality of CIS ($CuInSe_2$) films formed on a portion of the substrate; source/drain regions formed on a portion of the CIS film; an insulating layer formed on the CIS film and the source/drain regions; and a gate electrode formed on the insulating layer.

According to another aspect of the present invention, there is provided a method of manufacturing a TFT, including: preparing a substrate; forming a gate electrode on a portion of the substrate; forming an insulating layer covering the substrate and the gate electrode; forming a plurality of CIS films on the insulating layer so as to cover a region where the gate electrode is formed; forming a second conductive layer covering the CIS films; and forming a trench exposing a portion of a surface of the CIS films.

The method may further include forming a passivation layer covering the source/drain regions and the exposed portion of the surface of the CIS films.

According to another aspect of the present invention, there is provided a method of manufacturing a TFT, the method including: preparing a substrate; forming a plurality of CIS films on a portion of the substrate; forming source/drain regions on a portion of the CIS films; forming an insulating layer on a portion of the CIS films and the source/drain regions; and forming a gate electrode on the insulating layer.

The CIS films may be formed using $In_2Se_3$ and $Cu_2Se_3$, respectively. A conductivity type of the CIS film may be determined by a relative mole ratio of $In_2Se_3$ to $Cu_2Se_3$.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1A:
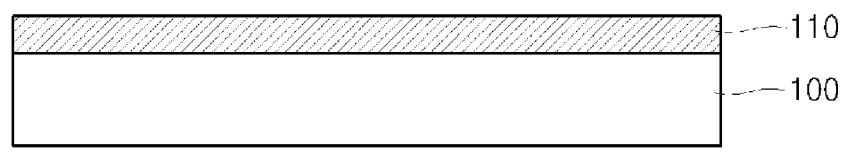
FIGS. 1A through 1I are cross-sectional views illustrating a method of manufacturing a thin film transistor (TFT) according to an embodiment of the present invention.

The present invention will now be described more fully with reference to the accompanying drawings, in which exemplary embodiments of the invention are shown.

The invention may, however, be embodied in many different forms and should not be construed as being limited to the embodiments set forth herein; rather, these embodiments are provided so that this disclosure will be thorough and complete, and will fully convey the concept of the invention to those of ordinary skill in the art. It will also be understood that when a layer is referred to as being "on" another layer or substrate, it can be directly on the other layer or substrate, or intervening elements may also be present. In the drawings, the thicknesses sizes of layers and regions are exaggerated for clarity. Like reference numerals in the drawings denote like elements, and thus their description will be omitted. The words "and/or" used in the present invention includes any and all combinations of one or more of the associated listed items.

Also, although terms like a first and a second are used to describe various elements, components, regions, layers, and/or portions in various embodiments of the present invention, the elements, components, regions, layers, and/or portions should not be limited by these terms. These terms are only used to distinguish one element, component, region, layer, or portion from another. Therefore, a first element, component, region, layer, or portion discussed below could be termed a second element, component, region, layer, or portion without departing from the teachings of the present invention.

Hereinafter, various related technologies using CIS in relation to diodes, which are electrical rectifying devices, will be described.

[Related Technology 1]

I. Shin, C. X. Qiu, S. N. Qiu, and J. F. Huang, "Schottky junctions on CuInSe$_2$ films," Journal of Applied Physics Vol 63, No. 2, 439-441, 1988.

In the related technology 1, a Schottky-diode formed by joining aluminum (Al) and p-type polycrystal CIS is described. Also, when an open-air thermal treatment is performed on the diode at 200° C., a p-type concentration of the CIS further increases due to oxygen in the air. On the other hand, the present invention describes that a switching transistor can be formed by joining an n-type CIS and a p-type CIS.

[Related Technology 2]

Lee Sang Soo, Kim Kyoung Am, Jo Gyu Man, Song Ki Bong, "Current and light properties in heterojunction structure using n-type CIS and p-type CuSe," Optical Society of Korea Summer Meeting, 2006.

In the related technology 2, a diode structure formed by a heterojunction between n-type CIS and p-type CuSe is described, and electrical and optical rectifying functions of the diode structure are measured. On the other hand, the present invention suggests a junction using only CIS, and also suggests a device having the function of a diode and a structure of a transistor.

[Related Technology 3]

U.S. Pat. No. 5,948,176, Kannan V. Ramanathan, Miguel A. Contreras, Raghu N. Bhattacharya, James Keane, Rommel Noufi, "Cadmium-free junction fabrication process for CuInSe. sub. 2 thin film solar cells,"

In the related technology 3, unlike a conventional solar cell manufactured with CdS and n-type CIS, a structure of a solar cell manufactured with p-type CIS and zinc oxide without cadmium (Cd) is described. On the other hand, the present invention describes a device having rectifying and switching functions, and also uses a structure formed by joining n-type CIS and p-type CIS.

[Related Technology 4]

Choi In Hwan (Insolartech, Inc.), Korean Patent Publication No. 2005-0013063, "Method of manufacturing absorption layer of solar cell,"

In the related technology 4, a method of manufacturing a CIS thin film so as to have a nearly stoichiometric structure, is provided. The related technology 4 is limited to a method of manufacturing the CIS thin film, and does not describe a device and method of manufacturing the device, which are described herein in relation to the present invention.

FIGS. 1A through 1I are cross-sectional views illustrating a method of manufacturing a thin film transistor (TFT) according to an embodiment of the present invention.

Referring to FIG. 1A, a substrate 100 is prepared. The substrate 100 can be selected considering light permeability, a process temperature for CIS material, and the like. The substrate 100 may be formed of a transparent material such as glass or quartz. A first conductive layer 110 is formed on the substrate 100 to form a gate electrode. The first conductive layer 110 may be formed by depositing material having conductivity, for example, a conductive polysilicon, indium-tin oxide (ITO), or a metal such as gold (Au), aluminum (Al), or the like. The first conductive layer 110 may be formed by conventional deposition methods such as chemical vapor deposition (CVD), plasma enhanced CVD (PECVD), low pressure CVD, physical vapor deposition (PVD), sputtering, atomic layer deposition (ALD), and the like. Layers, which are formed on the substrate, may be formed using a conventional deposition method as described above and a detailed description thereof will be omitted here for brevity.

Figure 1B:
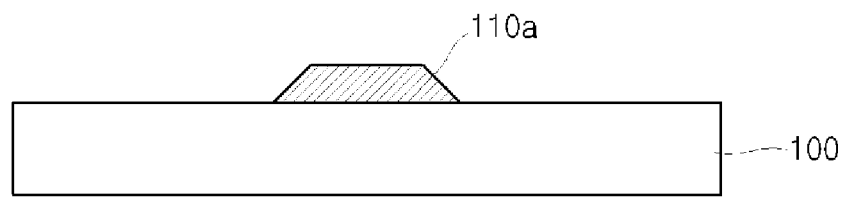

Referring to FIG. 1B, a gate electrode 110a is formed by etching the first conductive layer 110. The gate electrode 110a switches on/off a light current flowing into an n-type CIS layer 130a (see FIG. 1F) and a p-type CIS layer 140a (see FIG. 1F), formed later. The first conductive layer 110 may be formed by a conventional method, for example, a patterning method using a photoresist mask or a hard mask with a silicon nitride layer, or the like. Layers, which are formed on the substrate, may be etched using a conventional patterning method as described above and a detailed description thereof will be omitted here for brevity.

Figure 1C:
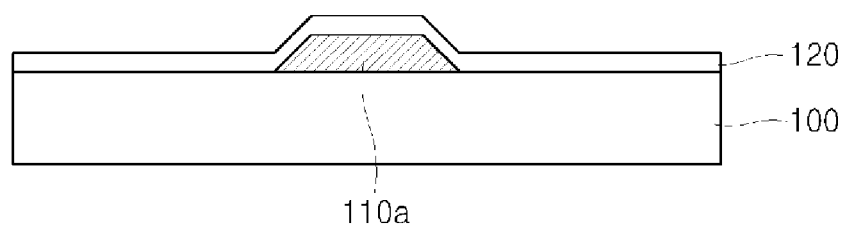

Referring to FIG. 1C, an insulating layer 120 is formed on the gate electrode 110a and the substrate 100. For example, the insulating layer 120 may be formed of silicon oxide (SiO$_2$) or polymethyl methacrylate (PMMA) which is an organic polymer material. The insulating layer 120 may maintain good contact between the gate electrode 110a and the n-type CIS layer 130a (see FIG. 1F) formed later. In order to ensure this good contact, the insulating layer 120 may be formed of SiO$_2$. A thickness of the insulating layer 120 may be in a range of 2000 Å to 5000 Å. However, the material and the thickness of the insulating layer 120 are exemplary, and the present invention is not limited thereto.

Figure 1D:
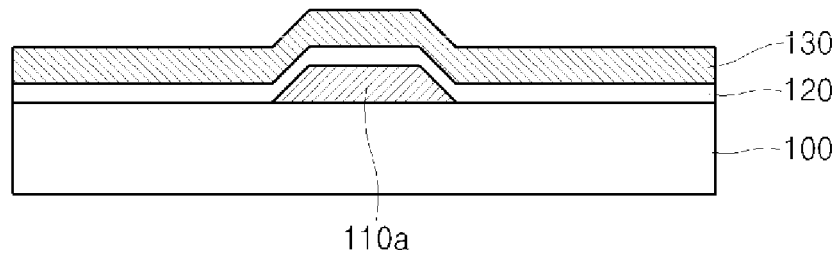
Figure 1E:
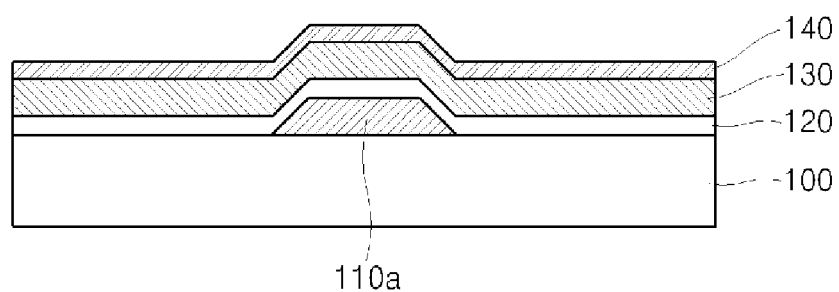

Referring to FIGS. 1D and 1E, a plurality of CIS layers 130 and 140 are sequentially formed on the insulating layer 120. The n-type CIS layer 130 is formed on the insulating layer 120, and the p-type CIS layer 140 is formed on the n-type CIS layer 130. However, this is exemplary, and the present invention is not limited thereto. That is, the p-type CIS layer 140 may be first formed on the insulating layer 120, and then the n-type CIS layer 130 may be formed on the insulating layer 120. A method of forming the n-type CIS layer 130 and the p-type CIS layer 140 will now be described.

Figure 1F:
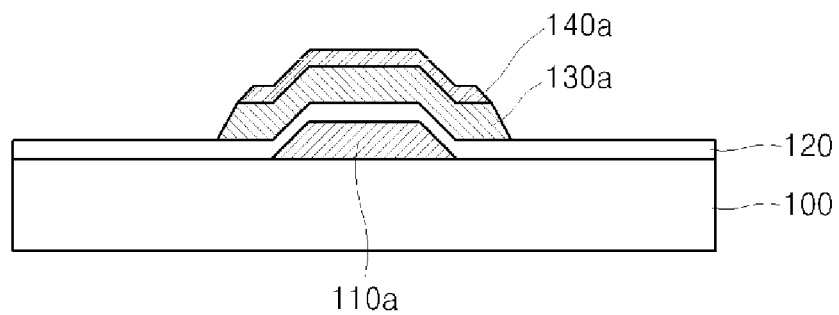

Referring to FIG. 1F, the n-type CIS layer 130 and the p-type CIS layer 140 are patterned to form an n-type CIS film 130a and a p-type CIS film 140a.

Figure 1G:
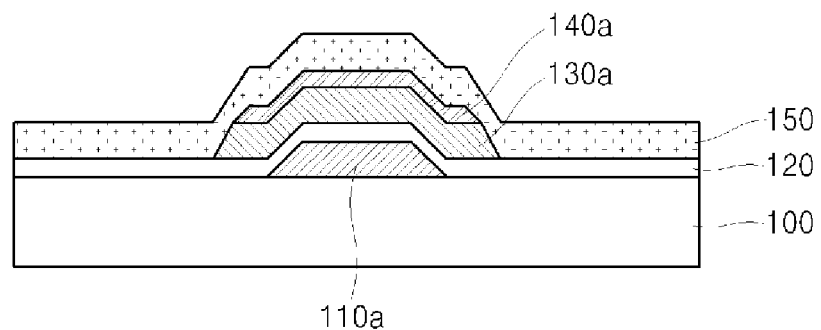

Referring to FIG. 1G, a second conductive layer 150 is formed to cover the p-type CIS film 140a and the exposed insulating layer 120. The second conductive layer 150 may be formed by depositing a conductive material, for example, polysilicon, indium-tin oxide (ITO), metal such as gold (Au), aluminum (Al) or the like. A thickness of the second conductive layer 150 may be in a range of 500 Å to 4000 Å. However, the material and the thickness of the second conductive layer 150 are exemplary, and the present invention is not limited thereto.

Figure 1H:
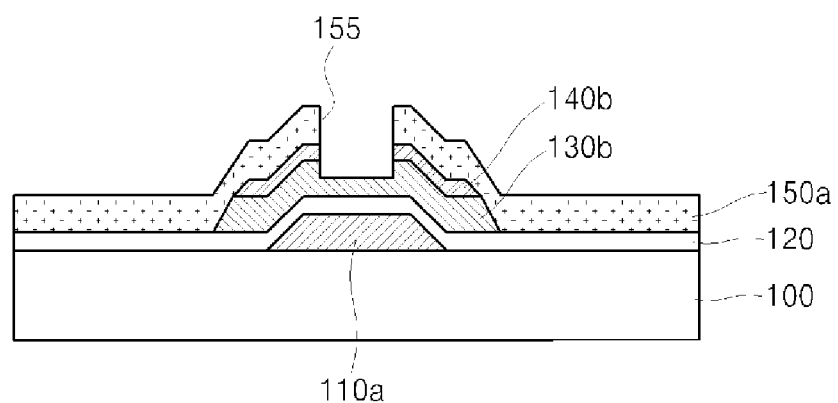

Referring to FIG. 1H, a trench 155 is formed by etching the second conductive layer 150 and the p-type CIS film 140a, which are located on the gate electrode 110a, so as to expose the n-type CIS film 130b. At this time, a portion of the n-type CIS film 130b may be further etched. The etching process may be performed simultaneously or may be serially performed using a plurality of masks. When the etching process is performed, the second conductive layer 150 is separated into source/drain regions 150a, and the n-type CIS film 130b becomes an active layer. As described above, when the p-type CIS layer 140 is first formed and then the n-type CIS layer 130 is formed on the substrate 100, the p-type CIS film 140b becomes an active layer.

The active layer is where an electrical channel is formed. The channel is formed by applying a voltage to a gate electrode as in a conventional transistor. In the transistor according to the present invention, the channel may be formed by irradiating light onto the active layer, for example, onto the n-type CIS film 130b or the p-type CIS film 140b. This is based on the excellent light sensitivity of CIS. That is, the active layer absorbs light energy to generate and move electron-hole pairs, so that an electrical resistance between source/drain electrodes 150a is decreased.

FIG. 1H shows that the source/drain regions 150a is formed on a portion of the insulating layer 120 which is not in contact with the gate electrode 110a after performing the etching process. However, this is exemplary, and the present invention is not limited thereto. Therefore, the source/drain regions 150a may not be present on a portion of the insulating layer 120 which is not in contact with the gate electrode 110a, because the source/drain regions 150a are removed by the etching process.

Figure 1I:
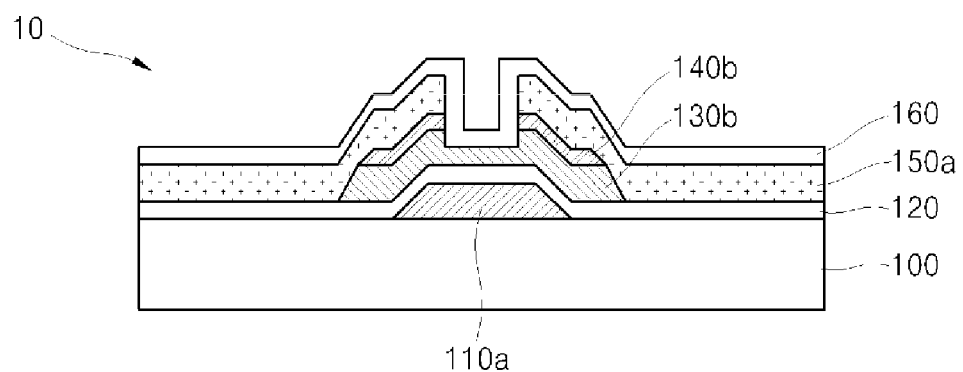

Referring to FIG. 1I, a passivation layer 160 covering the source/drain regions 150a and the inside of the trench 155 is selectively formed, thereby completing a TFT 10.

The TFT 10 according to the embodiment of the present invention is usually called an inverted staggered type TFT. Accordingly, it will be understood by those of ordinary skill in the art that a transistor having an inverted staggered type back channel etched (BCE) structure or an inverted staggered type etch stopper (ES) structure is realized on the basis of the scope of an embodiment of the present invention. Such an inverted staggered type TFT 10 may have a higher light efficiency as compared to a normal staggered type TFT.

Figure 2A:
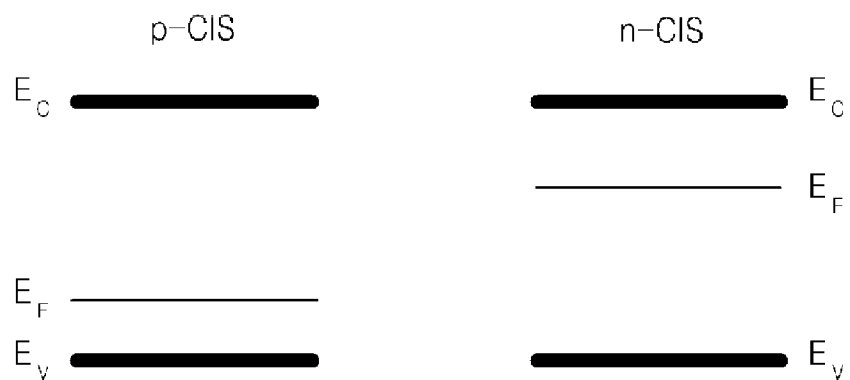
FIGS. 2A and 2B are schematic views illustrating an energy band before and after joining p-type CIS ($CuInSe_2$) and n-type CIS to each other.
Figure 2B:
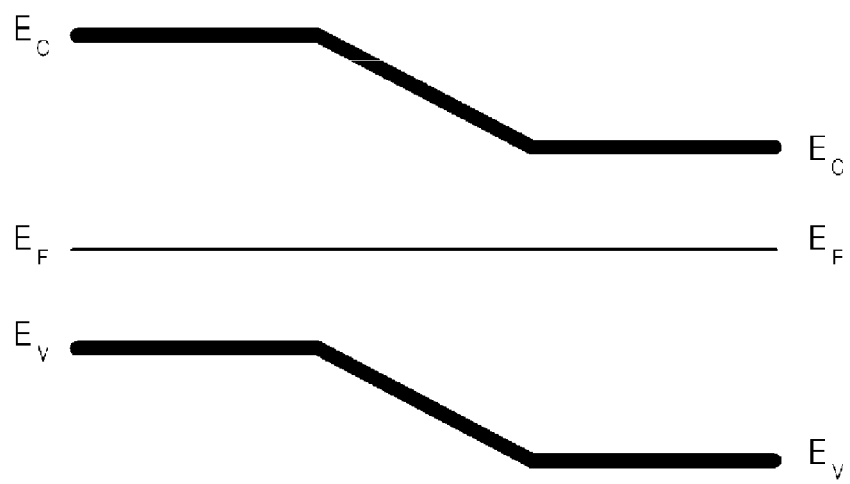

FIGS. 2A and 2B are schematic views illustrating an energy band diagram before and after joining p-type CIS (CuInSe$_2$) and n-type CIS to each other.

Referring to FIGS. 2A and 2B, an energy band in the thin film after joining the p-type CIS and the n-type CIS to each other is similar to an energy band of a conventional diode. When a positive potential (+V) is applied to the p-type CIS after joining the p-type CIS and the n-type CIS to each other, a potential barrier between the p-type CIS and the n-type CIS decreases, thereby increasing the flow of current. On the other hand, when a negative potential (−V) is applied to the p-type CIS after joining the p-type CIS and the n-type CIS to each other, a potential barrier between the p-type CIS and the n-type CIS increases, thereby decreasing or blocking the flow of current. Accordingly, the junction between the p-type CIS and the n-type CIS can provide an electrical rectifying function.

Figure 3:
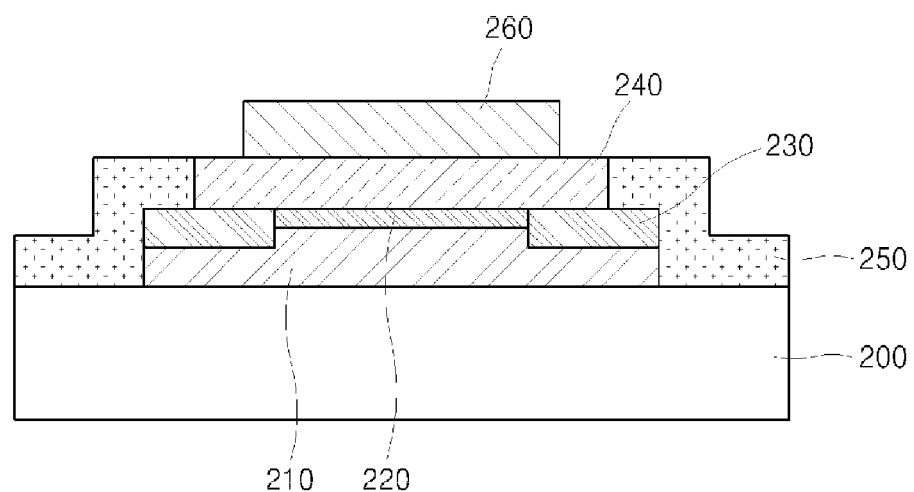
FIG. 3 is a cross-sectional view illustrating a TFT according to another embodiment of the present invention.

FIG. 3 is a cross-sectional view illustrating a TFT according to another embodiment of the present invention. Hereinafter, any repeated description with regard to the above embodiments will be omitted in order to clearly and simply describe characteristics of the present embodiment.

Referring to FIG. 3, the present invention can be realized with a normal staggered type TFT. That is, a plurality of CIS films 210 and 220 are formed on a substrate 200. The CIS film 210 and 220 is a combination of an n-type CIS film and a p-type CIS film, and the n-type CIS film may be formed on the p-type CIS film, or vice-versa. Source/drain regions 230 are formed at both sides so as to be respectively connected with a plurality of CIS films 210 and 220. An insulating layer 240 is formed on the CIS film 220. Source/drain electrodes 250 are formed so as to be respectively connected with the source/drain regions 230. Subsequently, a gate electrode 260 is formed on the insulating layer 240, thereby completing a normal staggered type TFT. Such a normal staggered type TFT can have a switching function. The material and the method of forming a substrate and films or layers of the normal staggered type TFT are described in relation to FIGS. 1A to 1I, and thus a description thereof will be omitted here for brevity.

Figure 4:
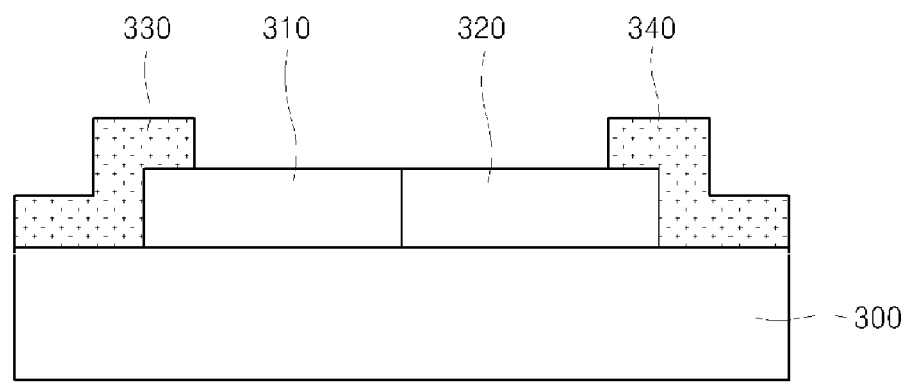
FIG. 4 is a schematic cross-sectional view illustrating a diode using p-type CIS and n-type CIS according to another embodiment of the present invention.

FIG. 4 is a schematic cross-sectional view illustrating a diode using p-type CIS and n-type CIS according to another embodiment of the present invention.

Referring to FIG. 4, a plurality of first and second CIS films 310 and 320, which are joined to each other, are formed on the substrate 300. When the first CIS film 310 is an n-type CIS film, the second CIS film 320 becomes a p-type CIS film. On the contrary, when the first CIS film 310 is a p-type CIS film, the second CIS film 320 becomes an n-type CIS film. Then, a p-n diode structure can be realized by forming electrodes 330 and 340 that are connected to each of those films. The diode can provide a rectifying function by forming the CIS film into the n-type CIS film and the p-type CIS film.

Hereinafter, a method of forming the n-type CIS layer 130 and the p-type CIS layer 140 will be described in detail.

Figure 5:
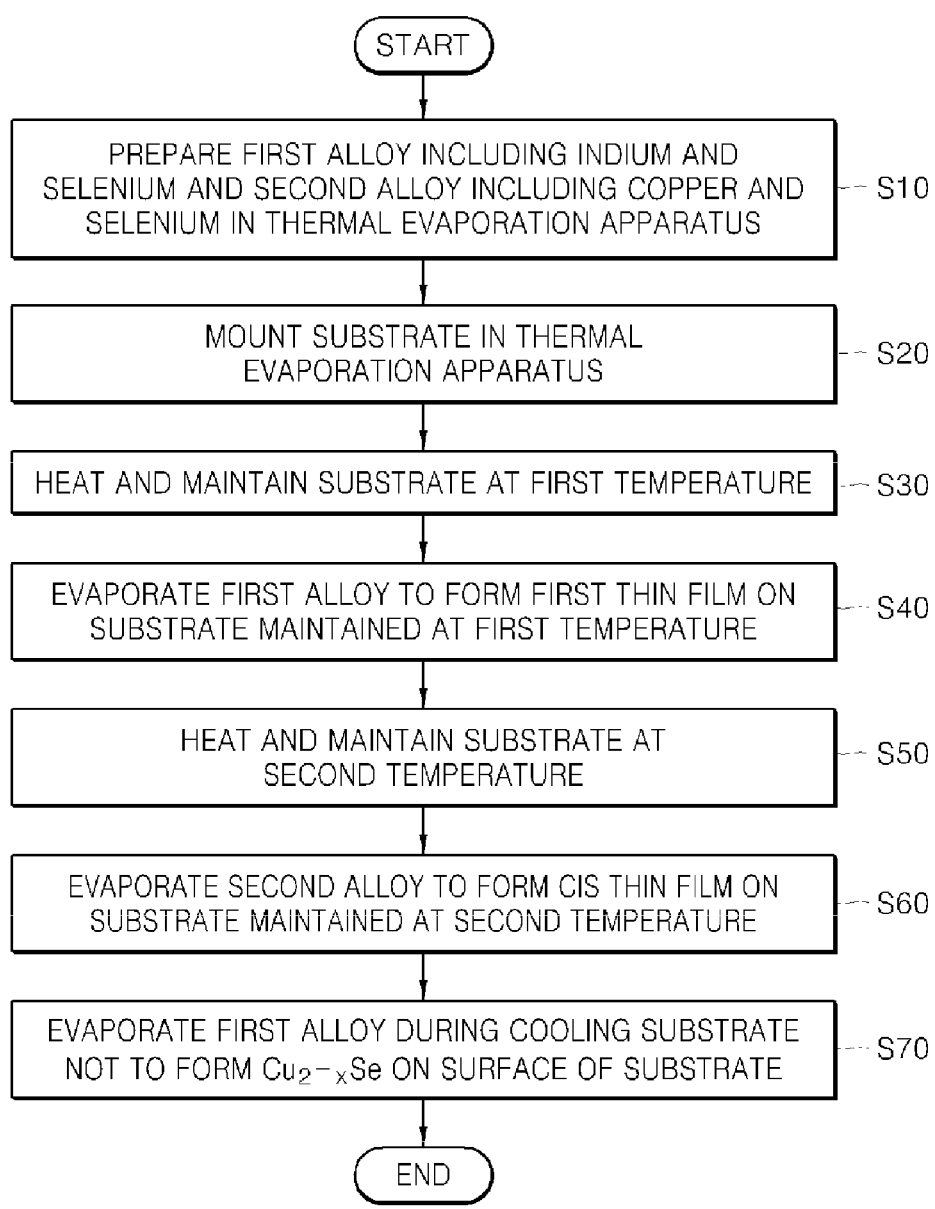
FIG. 5 is a flowchart of a method of manufacturing an n-type CIS layer and a p-type CIS layer according to an embodiment of the present invention.

FIG. 5 is a flowchart of a method of forming the n-type CIS layer 130 and the p-type CIS layer 140 according to an embodiment of the present invention.

Referring to FIG. 5, a first alloy, including indium (In) and selenium (Se), and a second alloy, including copper (Cu) and Se, are prepared in a thermal evaporation apparatus including a conventional tungsten (W) boat (Operation S10). For example, the first alloy may be $In_2Se_3$ and the second alloy may be $Cu_2Se_3$. However, this is exemplary, and the present invention is not limited thereto. Then, a substrate is formed in the thermal evaporation apparatus (Operation S20).

Next, the substrate is heated and maintained at a first temperature (Operation S30). In order to form a first thin film on the substrate maintained at the first temperature, the first alloy is evaporated (Operation S40). The first temperature may be in a range of 150° C. to 350° C. Accordingly, a thin film including the first alloy, for example, $In_2Se_3$ may be formed on the substrate.

Then, the substrate is heated and maintained at a second temperature (Operation S50). In order to form a thin film including a CuInSe$_2$ (CIS) thin film on the substrate maintained to the second temperature, the second alloy is evaporated (Operation S60). The second temperature may be the same as the first temperature or may be higher than the first temperature. For example, the second temperature may be in a range of 400° C. to 550° C. However, this is exemplary, and the present invention is not limited thereto. As described above, the second alloy may be $Cu_2Se_3$. Accordingly, the evaporated second alloy reacts with the first alloy to form a CuInSe$_2$ (CIS) thin film on the substrate where the thin film including the first alloy, for example, the $In_2Se_3$ thin film is formed.

Next, the first alloy is evaporated again while the substrate is cooled (Operation S70), which is an optional process for preventing $Cu_{2-x}Se$ from being formed on a surface of the substrate. At this time, the amount of the first alloy, which is evaporated again, is much less than the amount of the first alloy which is evaporated in the formal process. By performing the above process, a thin n-type CIS and/or a p-type CIS thin film, which are/is appropriate for a thin film type transistor and a light thin film type transistor, are/is formed. However, the description of the method of forming the above-described n-type CIS film and p-type CIS film is exemplary, and the present invention is not limited thereto.

The CIS thin film formed by the above-described method has different conductivity according to a relative mole ratio of the first alloy to the second alloy. When the relative mole ratio of the first alloy to the second alloy, for example, the mole ratio of $In_2Se_3/Cu_2Se_3$ is in a range of 0.1 to 0.5 (that is, $0.1 \leq$ mole ratio of $In_2Se_3/Cu_2Se_3 \leq 0.5$), the CIS thin film has a p-type conductivity. On the other hand, when the mole ratio of $In_2Se_3/Cu_2Se_3$ is in a range of 0.6 to 0.9 ($0.6 \leq$ mole ratio of $In_2Se_3/Cu_2Se_3 \leq 0.9$), the CIS thin film has an n-type conductivity. Therefore, as the relative amount of $In_2Se_3$ increases, a tendency for the CIS thin film to be an n-type semiconductor increases. Also, as the amount of $Cu_2Se_3$ increases, a tendency for the CIS thin film to be a p-type semiconductor increases. Accordingly, the type and concentration of a carrier of the formed thin film varies. As described above, experimental values with regard to the type and concentration of the CIS carrier formed according to the mole ratio of $In_2Se_3/Cu_2Se_3$ are shown in Table 1.

TABLE 1

| serial number | mole ratio of $In_2Se_3/Cu_2Se_3$ | doping type | concentration of carrier |
| --- | --- | --- | --- |
| 1 | 0.75 | n-type | $-5 \times 10^{11}$ |
| 2 | 0.6 | n-type | — |
| 3 | 0.5 | p-type | $+5.2 \times 10^{16}$ |
| 4 | 0.33 | p-type | $+7 \times 10^{16}$ |

In a TFT according to the present invention, a TFT using a p-type CIS thin film and an n-type CIS thin film changes a flow of current between a source and a drain due to electrical control of a gate voltage or light reactivity, and accordingly provides a switching function. Also, the p-type CIS thin film and the n-type CIS thin film are joined to each other, and thereby provide a rectifying function and form a diode structure.

The TFT of the present invention comprises a CIS film having an excellent light efficiency, and accordingly a TFT having an excellent light efficiency can be easily realized. Also, compared to a conventional method of manufacturing a CMOS, the TFT of the present invention can be formed by performing a low temperature process, can use a low-priced glass substrate, does not necessarily need an ion implantation process, and accordingly is economical.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A thin film transistor (TFT), comprising:
 a substrate;
 a gate electrode formed on a portion of the substrate;
 an insulating layer covering the substrate and the gate electrode;
 a plurality of CIS ($CuInSe_2$) films formed on the insulating layer so as to cover a region where the gate electrode is formed, wherein the plurality of CIS films comprise a first CIS film formed on the insulating layer and a second CIS film formed on the first CIS film; and
 source/drain regions separated from each other by a trench exposing a portion of a surface of the CIS films, wherein the trench removes a portion of the second CIS film to expose the first CIS film so that the first CIS film becomes an active layer,
 wherein the CIS films have an n-type conductivity and a p-type conductivity, respectively, wherein the CIS films comprise a structure where a p-type CIS film is formed on an n-type CIS film.

2. The TFT of claim 1, wherein the CIS films are formed using $In_2Se_3$ and $Cu_2Se_3$, respectively.

3. The TFT of claim 2, wherein a conductivity type of the CIS film is determined by a relative mole ratio of $In_2Se_3$ to $Cu_2Se_3$.

4. The TFT of claim 3, wherein, when a relative mole ratio of the $In_2Se_3$ to the $Cu_2Se_3$ is in a range of 0.1 to 0.5, the CIS film has a p-type conductivity.

5. The TFT of claim 3, wherein, when a relative mole ratio of the $In_2Se_3$ to the $Cu_2Se_3$ is in a range of 0.6 to 0.9, the CIS film has an n-type conductivity.

6. The TFT of claim 1, further comprising a passivation layer covering the source/drain regions and the exposed portion of the surface of the CIS films.

7. The TFT of claim 1, wherein the substrate is formed of glass or quartz.

8. The TFT of claim 1, wherein the gate electrode comprises a conductive polysilicon, indium-tin oxide (ITO), or a metal.

9. The TFT of claim 1, wherein the insulating layer comprises silicon oxide ($SiO_2$) or polymethyl methacrylate (PMMA) which is an organic polymer material.

10. The TFT of claim 1, wherein the source/drain regions comprise a conductive polysilicon, indium-tin oxide (ITO), or a metal.

11. A thin film transistor (TFT), comprising:
 a substrate;
 a plurality of CIS ($CuInSe_2$) films formed on a portion of the substrate;
 source/drain regions formed on a portion of the CIS films;
 an insulating layer formed on the CIS films and the source/drain regions; and
 a gate electrode formed on the insulating layer.

* * * * *